(12) United States Patent
Madan et al.

(10) Patent No.: US 7,622,386 B2
(45) Date of Patent: Nov. 24, 2009

(54) METHOD FOR IMPROVED FORMATION OF NICKEL SILICIDE CONTACTS IN SEMICONDUCTOR DEVICES

(75) Inventors: Anita Madan, Danbury, CT (US); Robert J. Purtell, West Jordan, UT (US); Keith Kwong Hon Wong, Wappingers Falls, NY (US); Jun-Keun Kwak, Seoul (KR)

(73) Assignees: International Business Machines Corporation, Armonk, NY (US); Samsung Electronics Co., Ltd. (KR)

( * ) Notice: Subject to any disclaimer, the term of this patent is extended or adjusted under 35 U.S.C. 154(b) by 405 days.

(21) Appl. No.: 11/567,517

(22) Filed: Dec. 6, 2006

(65) Prior Publication Data

US 2008/0138985 A1  Jun. 12, 2008

(51) Int. Cl.
*H01L 21/44* (2006.01)
(52) U.S. Cl. .................. 438/682; 438/630; 438/649; 438/655
(58) Field of Classification Search .......... 438/630, 438/649, 651, 655, 682, 683, 685, 686
See application file for complete search history.

(56) References Cited

U.S. PATENT DOCUMENTS

| | | |
|---|---|---|
| 6,184,132 B1 | 2/2001 | Cantell et al. |
| 6,207,562 B1 | 3/2001 | Han |
| 6,465,369 B1 | 10/2002 | Teng et al. |
| 6,579,783 B2 | 6/2003 | Saigal et al. |
| 6,806,172 B1 | 10/2004 | Woo et al. |
| 6,849,555 B2 | 2/2005 | Lee et al. |
| 6,936,528 B2 | 8/2005 | Koo et al. |
| 7,446,042 B2 * | 11/2008 | Wu et al. .................... 438/682 |
| 2003/0215962 A1 | 11/2003 | Hausmann et al. |
| 2003/0228745 A1 | 12/2003 | Lur et al. |
| 2005/0221603 A1 | 10/2005 | Morad et al. |
| 2006/0057844 A1 | 3/2006 | Domenicucci et al. |
| 2007/0037393 A1 * | 2/2007 | Chiang et al. ............... 438/685 |
| 2007/0059878 A1 * | 3/2007 | Chang et al. ............... 438/233 |

FOREIGN PATENT DOCUMENTS

| | | |
|---|---|---|
| JP | 8255769 | 10/1996 |
| JP | 2004006536 | 1/2004 |
| JP | 2006179874 | 7/2006 |

* cited by examiner

*Primary Examiner*—Kevin M Picardat
(74) *Attorney, Agent, or Firm*—Cantor Colburn LLP; Yuanmin Cai

(57) ABSTRACT

A method of forming silicide contacts for semiconductor devices includes subjecting a silicon containing semiconductor wafer to a degas treatment at an initial degas temperature of about 250 to about 400° C., transferring the semiconductor wafer from a degas chamber to a deposition chamber, depositing a nickel containing layer over the wafer following transfer of the wafer from the degas chamber to the deposition chamber, and annealing the semiconductor wafer so as to create silicide regions at portions on the wafer where nickel material is formed over silicon.

10 Claims, 5 Drawing Sheets

METHOD FOR IMPROVED FORMATION OF NICKEL SILICIDE CONTACTS IN SEMICONDUCTOR DEVICES

BACKGROUND

The present invention relates generally to semiconductor device processing techniques and, more particularly, to an improved method for forming silicide contacts on semiconductor devices using nickel as the deposited metal.

In the manufacture of semiconductor devices, salicide (or self-aligned silicide) materials are formed upon gate conductors and diffusion regions to reduce the line resistance of a CMOS device, thereby improving the speed characteristics thereof. In salicide technology, a refractory metal or a near noble metal, such as titanium for example, is deposited on a silicon substrate. The deposited metal is then annealed, thereby forming a silicide layer only on the exposed areas of the substrate. The areas of unreacted metal left on the dielectric may then be selectively etched away without a masking step. Thus, the process is "self-aligning."

As circuit devices have continued to shrink in size, however, it has been found that titanium silicide ($TiSi_2$) becomes an unsatisfactory silicide material since the sheet resistance thereof begins to sharply increase when the linewidth of the device decreases below 0.20 μm. More recently, cobalt disilicide ($CoSi_2$) has been used as a replacement for titanium in salicide structures since it does not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process.

Attention has also recently turned to nickel (Ni) as a silicide metal. Although the use of Ni in silicide technology has certain advantages over Ti or Co, there are also problems associated with Ni. For instance, Ni (and alloys thereof) deposited on silicon (Si) can generate an interfacial layer of varying thickness, composition and crystallinity, depending upon the deposition temperature and ion bombardment conditions. Moreover, the quality control of silicide contacts in general becomes an increasingly difficult problem with smaller dimensions and more complex material mixtures. For instance, silicide growth may be non-uniform due to preferred growth along certain crystal planes or different levels of defect density due to implant damage or from silicon regrowth following anneal sequences. Accordingly, it would be desirable to be able to improve upon the manner in which the nickel/silicon interface is initially formed, so as to improve the quality of the resulting nickel silicide and crystalline nickel/nickel alloy layers.

SUMMARY

The foregoing discussed drawbacks and deficiencies of the prior art are overcome or alleviated, in an exemplary embodiment, by a method of forming silicide contacts for semiconductor devices, including: subjecting a silicon containing semiconductor wafer to a degas treatment at an initial degas temperature of about 250 to about 400° C.; transferring the semiconductor wafer from a degas chamber to a deposition chamber; depositing a nickel containing layer over the wafer following transfer of the wafer from the degas chamber to the deposition chamber; and annealing the semiconductor wafer so as to create silicide regions at portions on the wafer where nickel material is formed over silicon.

In another embodiment, a method of forming silicide contacts for semiconductor devices includes subjecting a silicon containing semiconductor wafer to a degas treatment at an initial degas temperature of about 250 to about 400° C.; transferring the semiconductor wafer from a degas chamber to a cooling chamber so as to initiate cooling of the wafer from the initial degas temperature; transferring the semiconductor wafer from the cooling chamber to a deposition chamber; depositing a nickel containing layer over the wafer following transfer of the wafer from the cooling chamber to the deposition chamber; and annealing the semiconductor wafer so as to create silicide regions at portions on the wafer where nickel material is formed over silicon.

TECHNICAL EFFECTS

As a result of the summarized invention, a solution is technically achieved in which the deposition process of nickel/nickel alloy silicide metal is modified to control the stoichiometry and thickness of an amorphous layer of nickel containing silicon, by adjusting the temperature of the wafer during metal (e.g., NiPt) deposition. This in turn results in smoother and more uniform nickel silicide structures, as well as fewer grain boundaries.

BRIEF DESCRIPTION OF THE DRAWINGS

Referring to the exemplary drawings wherein like elements are numbered alike in the several Figures.

DETAILED DESCRIPTION

Disclosed herein is a method for improved formation of nickel silicide contacts for a semiconductor device, in which the deposition process of the metal is modified to control the stoichiometry and thickness of the amorphous film by adjusting the temperature of the wafer during metal (e.g., NiPt) deposition. Briefly stated, the present embodiments provide an improved interfacial, amorphous layer of nickel and silicon atoms during the nickel deposition, as the result of a high temperature degas prior to the nickel deposition. The high temperature degas initially elevates the wafer temperature prior to transit from the degas chamber to the deposition layer. Although the wafer is allowed to cool slightly during metal deposition, it is still at a relatively elevated temperature with respect to conventional processing, thus promoting a more uniform nickel silicide structure. Moreover, the high temperature degas in a chamber separate from that of the deposition prevents the outgassed material (i.e. hydrocarbons) from contaminating the substrate during silicide metal deposition.

Figure 1:
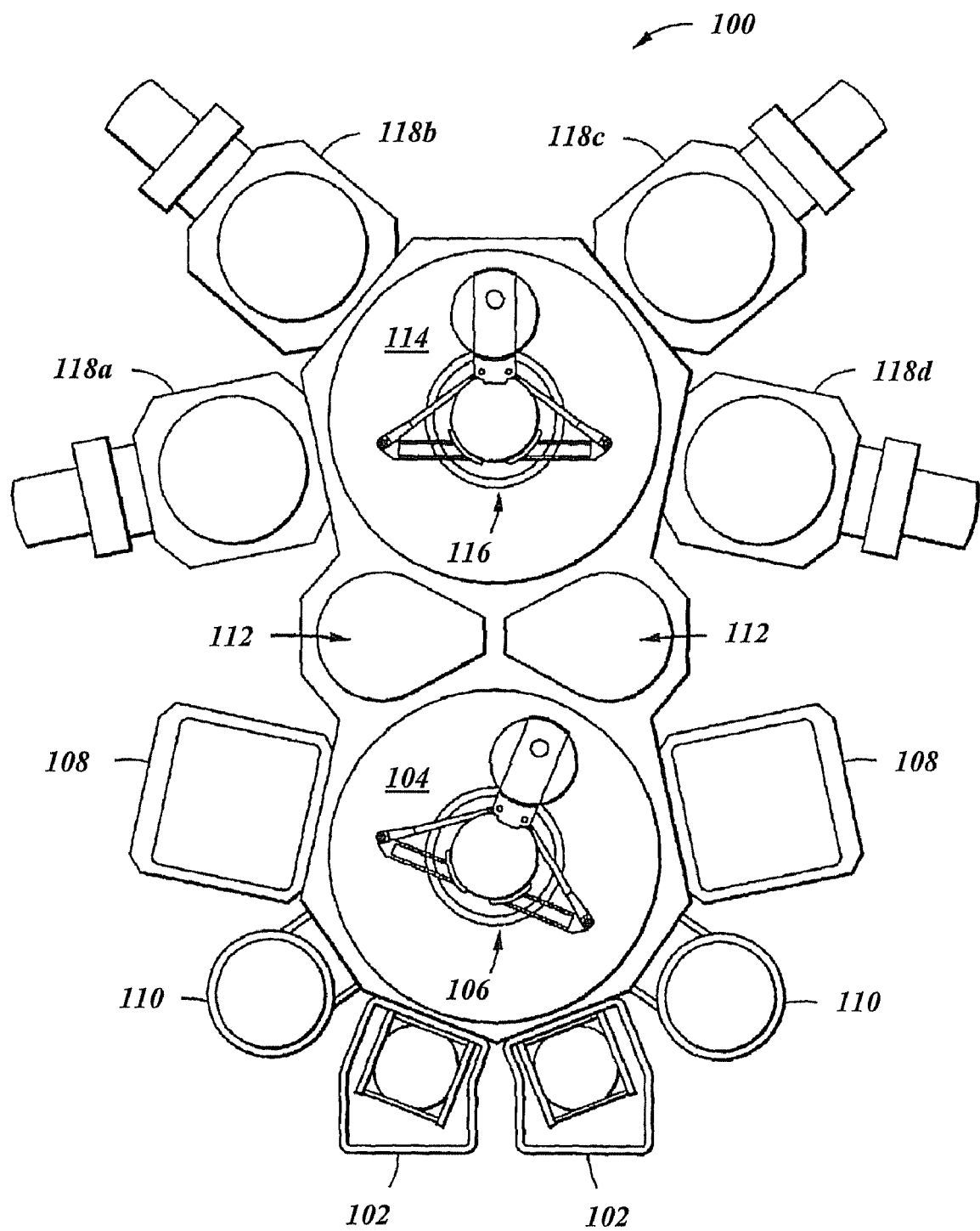
FIG. 1 is a schematic plan view of an exemplary cluster tool system having multiple substrate processing chambers, suitable for use in accordance with an embodiment of the invention.

Referring initially to FIG. 1, there is shown is a schematic view of an exemplary cluster tool system 100 having multiple substrate processing chambers, suitable for use in accordance with an embodiment of the invention. The cluster tool system 100 includes vacuum load/lock chambers 102 attached to a first stage transfer chamber 104. The load-lock chambers 102 maintain vacuum conditions within the first stage transfer chamber 104 while substrates enter and exit the system 100. A first robot 106 transfers substrates between the load-lock chambers 102 and one or more substrate processing chambers 108 and 110 attached to the first stage transfer chamber 104. Processing chambers 108 and 110 may be configured to perform a number of substrate processing operations such as, for example, chemical vapor deposition (CVD), physical vapor deposition (PVD), etching, pre-cleaning, degas, orientation, annealing and other substrate processes. The first robot 106 also transfers substrates to/from one or more transfer chambers 112 disposed between the first stage transfer chamber 104 and a second stage transfer chamber 114.

The transfer chambers 112 are used to maintain ultrahigh vacuum conditions in the second stage transfer chamber 114 while allowing substrates to be transferred between the first stage transfer chamber 104 and the second stage transfer chamber 114. A second robot 116 transfers substrates between the transfer chambers 112 and another plurality of substrate processing chambers 118a through 118d. Similar to processing chambers 108 and 110, the processing chambers 118a through 118d may be configured to perform a variety of substrate processing operations. For example, where the cluster tool system 100 is specifically configured to deposit a nickel metal silicide film, processing chambers 110 may represent degas/orientation chambers, while chambers 108 may be pre-clean chambers. Further, chambers 118a and 118b may represent PVD chambers outfitted to deposit a nickel film, while chamber 118c may be a PVD chamber outfitted to deposit a Ti/TiN capping layer. The transfer chambers 112 may be used as cool down chambers, while chamber 118d can represent an optional chamber.

Figure 2:
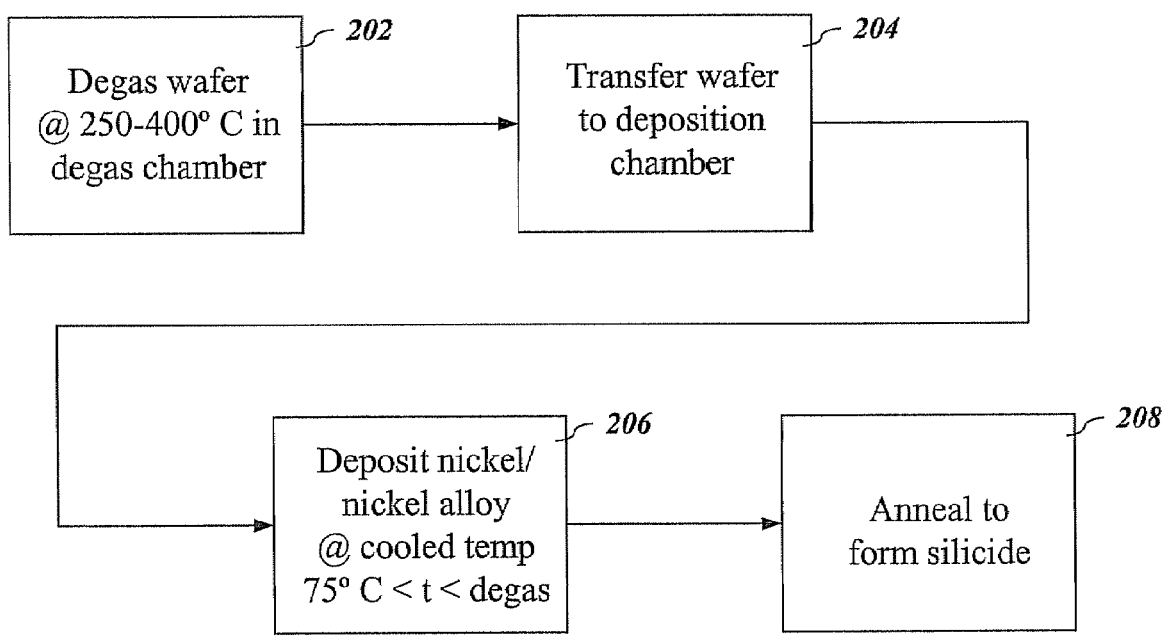
FIG. 2 is a process flow block diagram illustrating a method for improved formation of nickel silicide contacts for a semiconductor device, in accordance with an embodiment of the invention.

Referring now to FIG. 2, there is shown a process flow block diagram 200 illustrating a method for improved formation of nickel silicide contacts for a semiconductor device, in accordance with an embodiment of the invention. As shown in block 202, a semiconductor wafer is subjected to a degas treatment at a temperature of about 250° C. to about 400° C. in a degas chamber 110 such as shown in FIG. 1, for example. The high temperature degas may be implemented through a heated chuck in the degas chamber 110 or through lamp heating, for example, with an inert gas flowing in the chamber or under low vacuum conditions (e.g., less than 1 milliTorr of pressure).

Upon completion of the degas treatment, the heated wafer is transported to a deposition chamber as illustrated in block 204 of FIG. 2. Rather than heating the wafer in the deposition chamber itself, the wafer is instead slightly cooled from the initial degas temperature as a result of the transport between the degas and deposition chambers. In this manner, outgassed material removed during the degas heating will not get back onto the wafer during deposition. By way of example, the cooling time between degas and metal deposition may be on the order of about 30 seconds to about 5 minutes, and more particularly, about 1 minute.

Once inside the deposition chamber, a nickel or nickel alloy material is deposited over the wafer, as shown in block 206 of FIG. 2. In an exemplary embodiment, the deposition metal is a nickel platinum alloy. Depending upon the duration (and manner) of the cooling, the wafer temperature at the time of deposition may be in the range of about 75° C. up to the initially heated degas temperature. As indicated above, it has been determined that nickel deposition at such a range of elevated temperatures promotes better mixing of the nickel and silicon atoms prior to silicide formation. The end result is the contribution of nickel silicide formation at the two edges of the silicon/insulator boundary is smaller and thus the reverse linewidth effect (i.e., thicker silicide formation in narrower active areas) is observed to be smaller. In turn, a reduced reverse linewidth effect allows for a more uniform sheet resistivity ($\rho$) distribution between features of different sizes. Then, as shown in block 208 of FIG. 2, the wafer is annealed so as to create silicide contacts.

Figure 3:
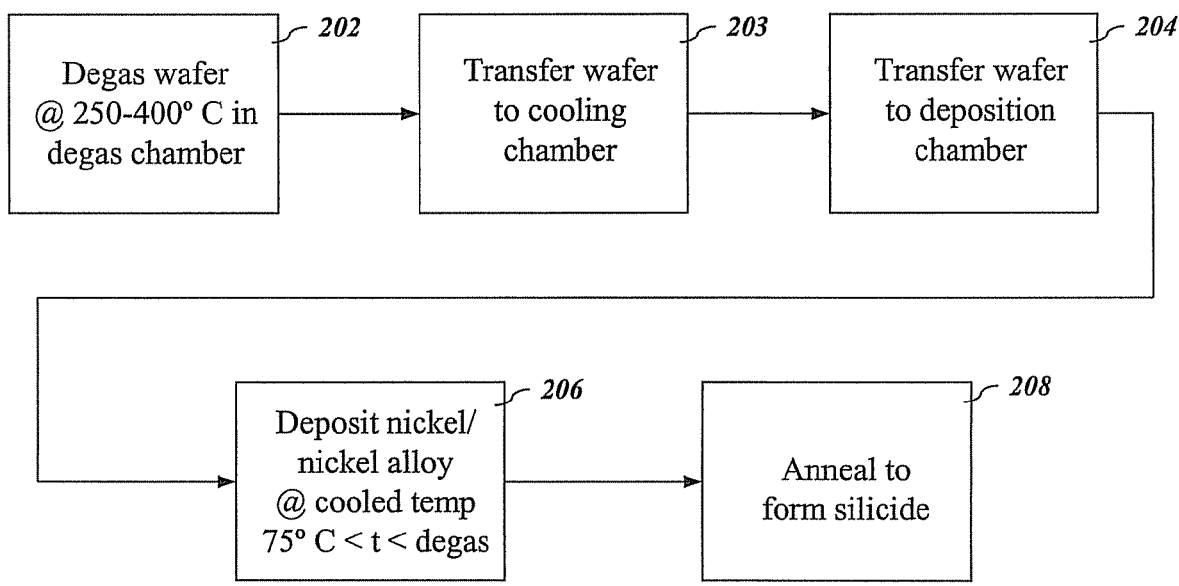
FIG. 3 is a process flow block diagram illustrating an alternative embodiment of the method shown in FIG. 2.

FIG. 3 is a process flow block diagram 300 illustrating an alternative embodiment of the method 200 of FIG. 2. In lieu of directly transporting the wafer from the high temperature degas chamber to the deposition chamber, the wafer may also be transported to a cooling chamber (e.g., one of the transfer chambers 112 of FIG. 1) between degas and deposition, as reflected in block 203 of FIG. 3.

Figure 4:
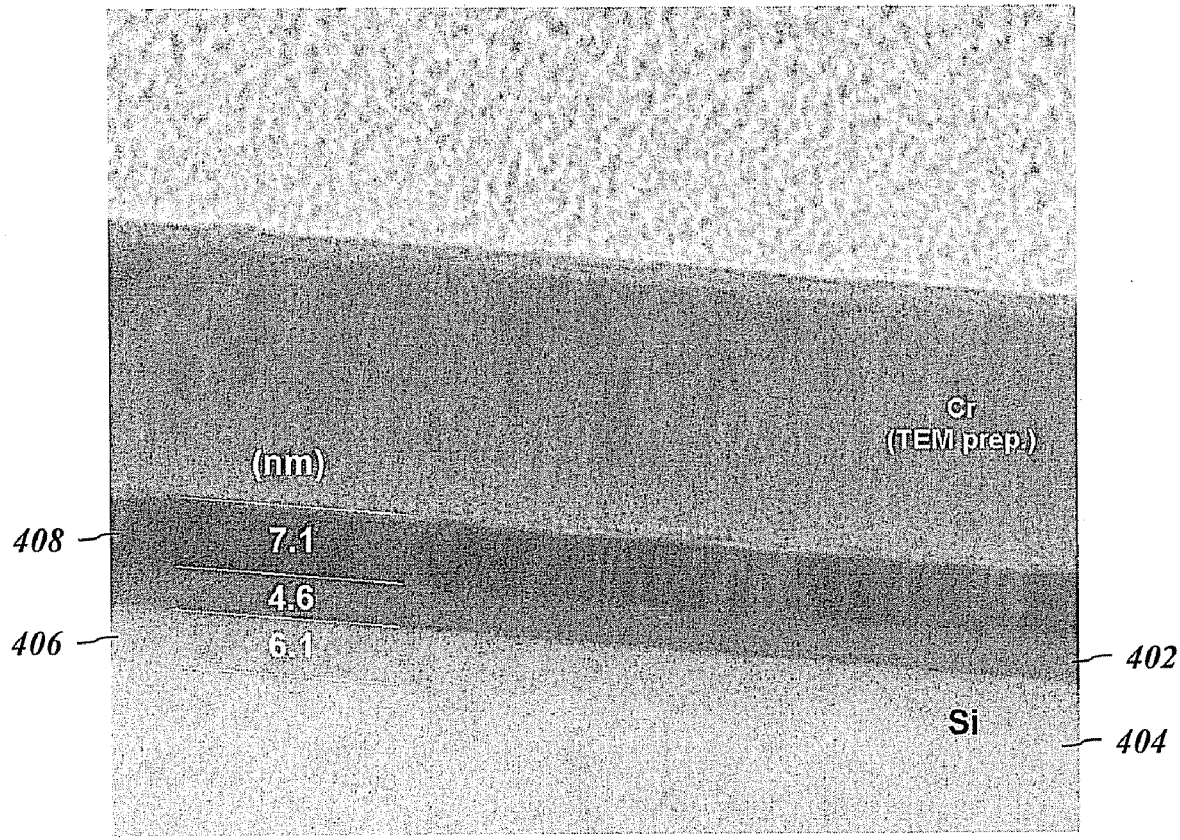
FIG. 4 is a Cross-sectional Transmission Electron Micrograph (XTEM) photograph of a deposited nickel platinum layer over a silicon substrate without the use of elevated temperature conditions.
Figure 5:
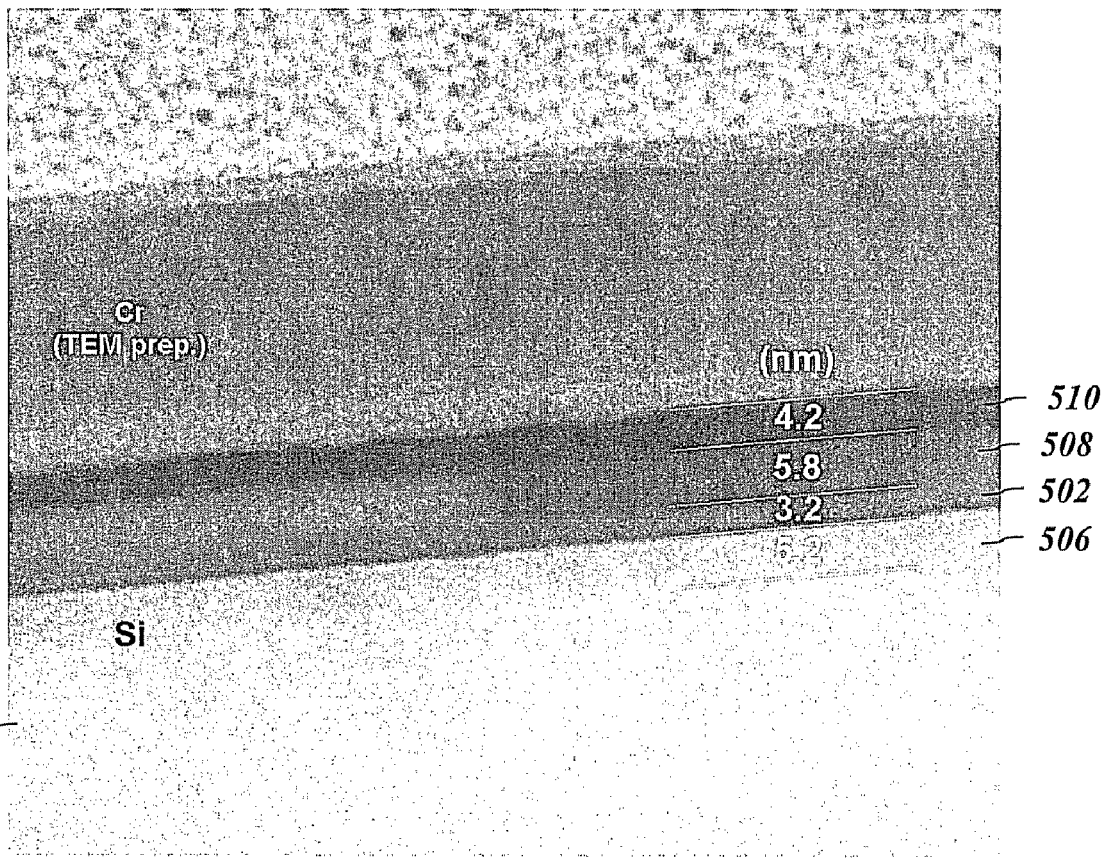
FIG. 5 is a Cross-sectional Transmission Electron Micrograph (XTEM) photograph of a deposited nickel platinum layer over a silicon substrate following a high temperature degas, in accordance with an embodiment of the invention.

Finally, FIGS. 4 and 5 are Cross-sectional Transmission Electron Micrograph (XTEM) photographs of a deposited nickel and cap layer over a silicon substrate, illustrating a comparison between NiPt deposited using lower deposition temperature conditions and the elevated degas embodiments disclosed herein. As shown in FIG. 4, a lower temperature (i.e., not preheated due to high temperature degas or otherwise) NiPt deposition results in amorphous layer 402 of about 4.6 nm in thickness at the Si interface 404. (A diffusion zone 406 of about 6.1 nm in thickness is also indicated in FIG. 4.) In addition, a residual crystalline NiPt layer 408 is formed at a thickness of about 7.1 nm upon the amorphous layer 402. It will be noted that, similar results were obtained using both a conventional sputter deposition chamber and an ALPS (Advanced Long-Throw Plasma System) deposition chamber.

In contrast, FIG. 5 illustrates a three-layer structure as a result of the elevated degas temperature deposition technique. An amorphous layer 502 of about 3.2 nm in thickness is formed at the Si interface 504 (again noting a diffusion zone 506 of about 5.2 nm in thickness). A crystalline reaction layer of NiPt 508 of about 5.8 nm in thickness is formed over the amorphous layer 504. In addition, a residual layer 510 of unreacted NiPt, having a thickness of about 4.2 nm, is left over the crystalline NiPt layer 508. It will be noted that the total stack, including the diffusion zone, is relatively close in thickness to that of the conventional process shown in FIG. 4 (18.4 nm vs. 17.8 nm).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming silicide contacts for semiconductor devices, the method comprising:

subjecting a silicon containing semiconductor wafer to a degas treatment at an initial degas temperature of about 400° C.;

transferring the semiconductor wafer from a degas chamber to a deposition chamber;

depositing a nickel containing layer over the wafer following transfer of the wafer from the degas chamber to the deposition chamber, wherein the nickel containing layer is deposited at a point in time when the semiconductor wafer has cooled to temperature range of about 250° C. to less than the initial degas temperature; and annealing the semiconductor wafer so as to create silicide regions at portions on the wafer where the nickel containing layer is formed over silicon.

2. The method of claim 1, wherein the wafer is cooled for about 30 seconds to about 5 minutes between the degas treatment and the deposition.

3. The method of claim 1, wherein the wafer is cooled for about 1 minute between the degas treatment and the deposition.

4. The method of claim 1, wherein the nickel containing layer further comprises one of a nickel layer and a nickel alloy layer.

5. The method of claim 1, wherein the nickel containing layer further comprises nickel platinum (NiPt).

6. A method of forming silicide contacts for semiconductor devices, the method comprising:

subjecting a silicon containing semiconductor wafer to a degas treatment at an initial degas temperature of about 400° C.;

transferring the semiconductor wafer from a degas chamber to a cooling chamber so as to initiate cooling of the wafer from the initial degas temperature;

transferring the semiconductor wafer from the cooling chamber to a deposition chamber;

depositing a nickel containing layer over the wafer following transfer of the wafer from the cooling chamber to the deposition chamber, wherein the nickel containing layer is deposited at a point in time when the semiconductor wafer has cooled to temperature range of about 250° C. to less than the initial degas temperature; and annealing the semiconductor wafer so as to create silicide regions at portions on the wafer where nickel material is formed over silicon.

7. The method of claim 6, wherein the wafer is cooled for about 30 seconds to about 5 minutes between the degas treatment and the deposition.

8. The method of claim 6, wherein the wafer is cooled for about 1 minute between the degas treatment and the deposition.

9. The method of claim 6, wherein the nickel containing layer further comprises one of a nickel layer and a nickel alloy layer.

10. The method of claim 6, wherein the nickel containing layer further comprises nickel platinum (NiPt).

* * * * *